United States Patent
Korenari et al.

(10) Patent No.: US 8,242,553 B2
(45) Date of Patent: Aug. 14, 2012

(54) THIN FILM TRANSISTOR SUBSTRATE AND THIN FILM TRANSISTOR USED FOR THE SAME

(75) Inventors: Takahiro Korenari, Kanagawa (JP); Hiroshi Tanabe, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 204 days.

(21) Appl. No.: 12/838,954

(22) Filed: Jul. 19, 2010

(65) Prior Publication Data

US 2011/0024755 A1    Feb. 3, 2011

(30) Foreign Application Priority Data

Jul. 29, 2009  (JP) ................................. 2009-176951
Jun. 23, 2010  (JP) ................................. 2010-142280

(51) Int. Cl.
*H01L 29/76* (2006.01)

(52) U.S. Cl. ............ 257/314; 257/59; 257/71; 257/261; 257/315; 438/129; 438/301

(58) Field of Classification Search ............ 257/59, 257/71, 261, 314, 315; 438/129, 301
See application file for complete search history.

(56) References Cited

U.S. PATENT DOCUMENTS

| | | | | |
|---|---|---|---|---|
| 5,627,392 A | * | 5/1997 | Diorio et al. | 257/315 |
| 7,038,283 B2 | | 5/2006 | Yanai et al. | |
| 7,732,261 B2 | * | 6/2010 | Shiba et al. | 438/129 |
| 2002/0142554 A1 | * | 10/2002 | Nakajima | 438/301 |
| 2003/0025127 A1 | | 2/2003 | Yanai et al. | |

FOREIGN PATENT DOCUMENTS

JP    2003-045892    2/2003

\* cited by examiner

*Primary Examiner* — Jarrett Stark
*Assistant Examiner* — Nicholas Tobergte
(74) *Attorney, Agent, or Firm* — Young & Thompson

(57) ABSTRACT

A thin film transistor (TFT) substrate includes first and second TFTs on the same substrate. The first TFT has a feature that a lower conductive layer or a bottom gate electrode layer is provided between the substrate and a first insulating layer while an upper conductive layer or a top gate electrode layer is disposed on a second insulating layer formed on a semiconductor layer which is formed on the first insulating layer. The first conductive layer has first and second areas such that the first area overlaps with the first conductive layer without overlapping with the semiconductor layer while the second area overlaps with the semiconductor layer, and the first area is larger than the second area while the second insulating layer is thinner than the first insulating layer. The second TFT has the same configuration as the first TFT except that the gate electrode layer is eliminated.

12 Claims, 13 Drawing Sheets

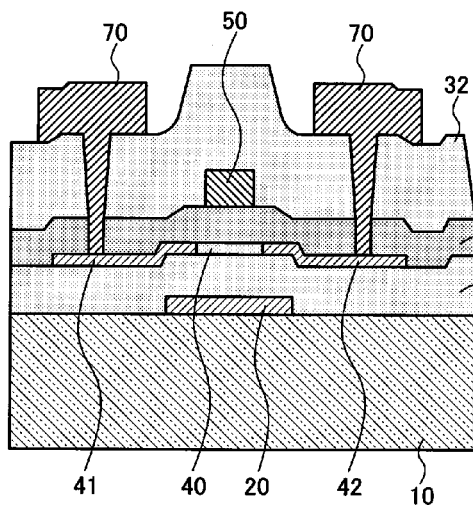 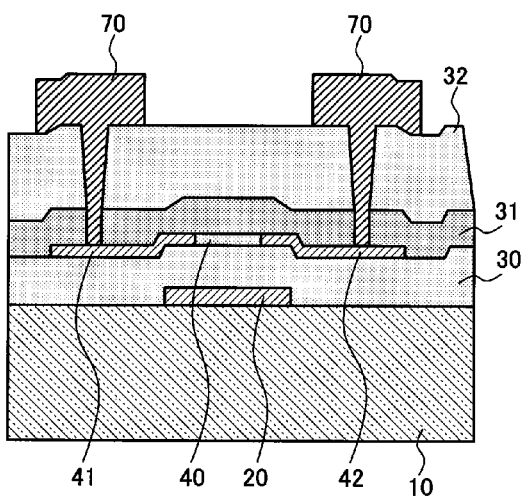
FIG. 9A    FIG. 9B
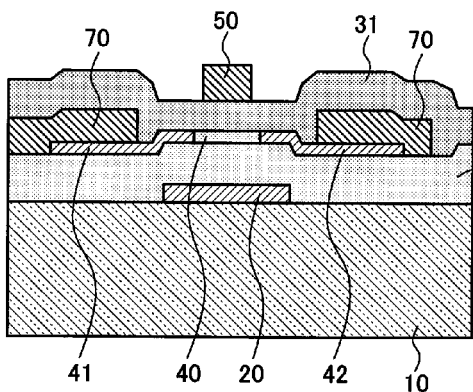 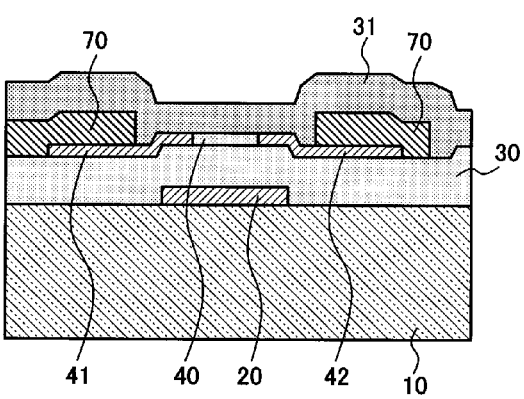
FIG. 10A    FIG. 10B

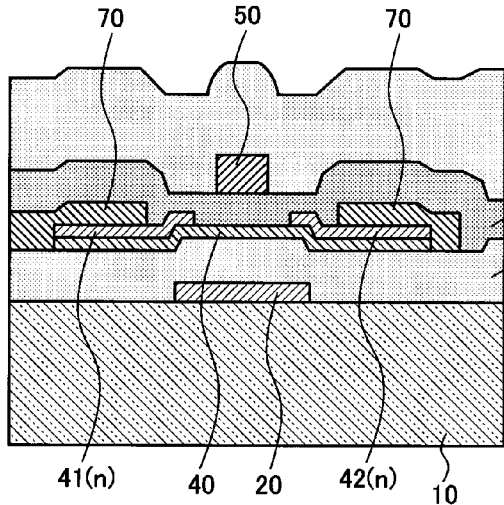 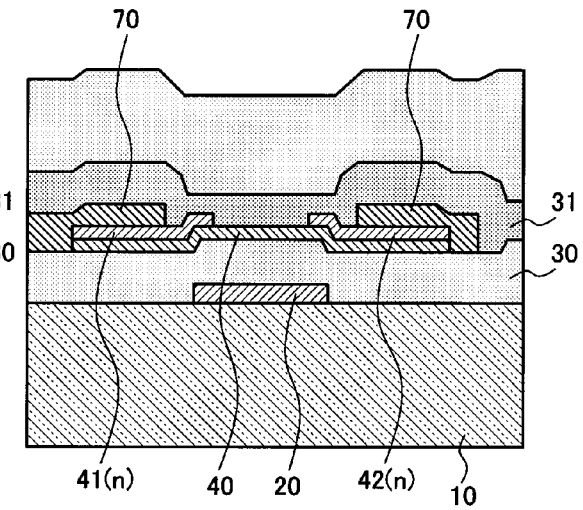
FIG. 15A             FIG. 15B
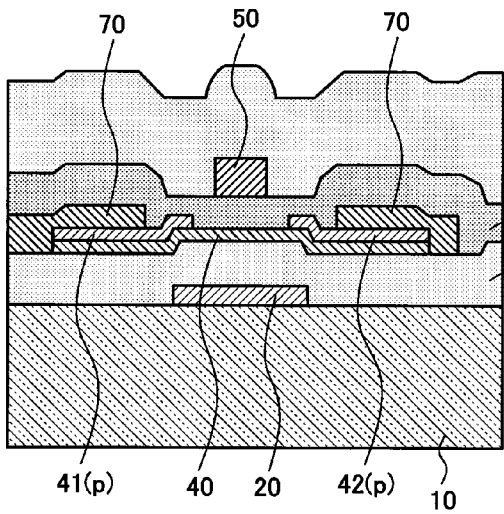 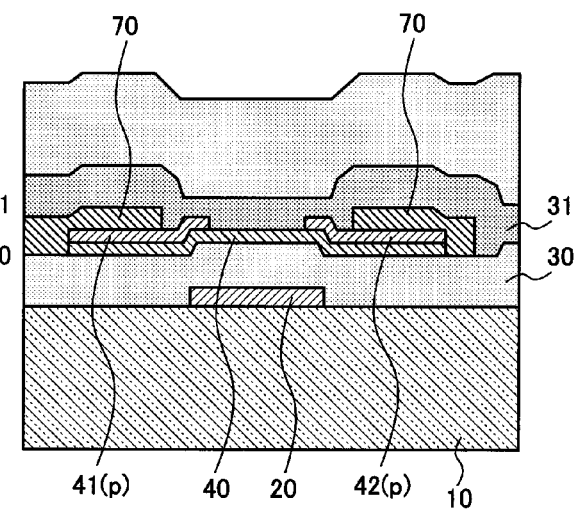
FIG. 16A             FIG. 16B

THIN FILM TRANSISTOR SUBSTRATE AND THIN FILM TRANSISTOR USED FOR THE SAME

This application is based upon and claims the benefit of priority from Japanese Patent Application No. 2009-176951, filed on Jul. 29, 2009, and Japanese Patent Application No. 2010-142280, filed on Jun. 23, 2010, the disclosure of which is incorporated herein in its entirety by reference.

TECHNICAL FIELD

The present invention relates to a thin film transistor (TFT) substrate or TFT circuits provided with plural types of TFTs differing in breakdown voltage capabilities, and more particularly, to a TFT substrate or TFT circuits provided with at least two TFTs driven by a relatively low voltage and a relatively high voltage.

BACKGROUND ART

In a liquid crystal display device using such a driver circuitry substrate provided with switching devices or so-called a TFT substrate, TFTs are formed on an insulating substrate made of a glass or a quartz, and it is being used for switching pixels and other driving circuits. As for the TFT substrate, recent technology requires much more functions for the TFT substrate by providing plural types of TFTs having different breakdown voltage capability characteristics on a single insulating substrate. Specifically, at least two types of TFTs are needed for the TFT substrate. One is a TFT driven at relatively low voltage (about 1.5-5 V) with high speed which is often used for a signal processing circuit or the like. The other is a TFT driven at relatively high voltage (about 10-40 V) which is often used for driving a pixel or a peripheral circuit.

In general, it is difficult to form such a TFT which is compatible for having a high current driving capability and a high breakdown voltage capability. Thus, different types of TFTs are formed separately on the same substrate such that one TFT having the high current driving capability and the other TFT having a high breakdown voltage capability are individually fabricated. For example, as indicated in FIG. 25 and paragraphs 118-124 of Japanese Patent Application Laid-Open No. 2003-45892 (Patent Document 1), a low voltage driving TFT and a high voltage driving TFT are designed to have different thickness of the respective gate insulating films between top gate electrodes and semiconductor layers. In such structure, the low voltage driving TFT is provided with a first gate insulating film on an upper part of the semiconductor layer such as a silicon layer while the high voltage driving TFT is provided with not only the first gate insulating film but also a second gate insulating film on an upper part of the semiconductor layer so that a total thickness of the gate insulating film of the high voltage driving TFT becomes a total sum of the thickness of the first gate insulating film and the second gate insulating film.

In the Patent Document 1, the low voltage driving TFT and the high voltage driving TFT require individual process to form each top gate electrode, respectively. In addition, the first and the second insulating films are respectively formed prior to forming the gate electrodes for the low voltage driving TFT and the high voltage driving TFT. Accordingly, such structure is disadvantageous in view of a production cost by requiring much more fabricating process.

SUMMARY

An exemplary object of the present invention is to provide a sort of compatible TFT in which different breakdown voltage capability characteristic can be easily changed to either type of breakdown voltage capability characteristics without increasing a top gate electrode formation process on the same substrate.

A thin film transistor (TFT) substrate according to an exemplary aspect of the invention includes first and second different types of TFTs on a same substrate. The first TFT has a feature that a lower conductive layer or a bottom gate electrode layer is provided between the substrate and a first insulating layer while an upper conductive layer or a top gate electrode layer is disposed on a second insulating layer formed on a semiconductor layer which is formed on the first insulating layer. The first conductive layer has first and second areas such that the first area overlaps with the first conductive layer without overlapping with the semiconductor layer while the second area overlaps with the semiconductor layer, and the first area is larger than the second area while the second insulating layer is thinner than the first insulating layer. The second TFT has the same configuration as the first TFT except that the gate electrode layer is eliminated.

BRIEF DESCRIPTION OF THE DRAWINGS

Exemplary features and advantages of the present invention will become apparent from the following detailed description when taken with the accompanying drawings in which:

FIG. 9A is a sectional view of a low voltage TFT which is formed on a substrate according to a third exemplary embodiment of the present invention having an offset configuration associated with the first exemplary embodiment;

FIG. 9B is a sectional view of a high voltage TFT which is formed on a same substrate shown in FIG. 9A according to the third exemplary embodiment of the present invention;

FIG. 10A is a sectional view of a low voltage TFT which is formed on a substrate according to a third exemplary embodiment of the present invention having an offset configuration associated with the second exemplary embodiment;

FIG. 10B is a sectional view of a high voltage TFT which is formed on a same substrate shown in FIG. 10A according to the third exemplary embodiment of the present invention;

FIG. 15A is a sectional view of an n-channel type low voltage TFT which is formed on a substrate according to a modified example of the third exemplary embodiment of the present invention having a similar configuration shown in FIG. 13A for a CMOS (Complementary Metal Oxide Semiconductor) device;

FIG. 15B is a sectional view of an n-channel type high voltage TFT which is formed on a same substrate shown in FIG. 15A according to the modified example of the third exemplary embodiment of the present invention having a similar configuration shown in FIG. 13B for the CMOS device;

FIG. 16A is a sectional view of a p-channel type low voltage TFT which is formed on a substrate according to a modified example of the third exemplary embodiment of the present invention having a similar configuration shown in FIG. 13A for the CMOS device;

FIG. 16B is a sectional view of a p-channel type high voltage TFT which is formed on a same substrate shown in FIG. 16A according to the modified example of the third exemplary embodiment of the present invention having a similar configuration shown in FIG. 13B for the CMOS device;

EXEMPLARY EMBODIMENT

Figure 1A:
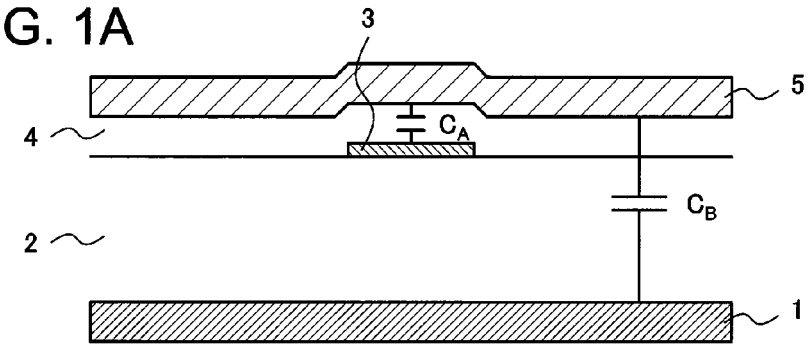
FIG. 1A is an exemplary sectional view showing a TFT configuration according to the present invention.

First, a basic concept of the present invention will be described prior to describing an exemplary embodiment of the present invention. In order to solve the above-mentioned problem, a first gate electrode layer and a second gate electrode layer are provided so as to sandwich a semiconductor layer such as a silicon layer on the insulating substrate. Hereinafter, the first gate electrode layer located under the semiconductor layer (near side of the substrate) is called a bottom gate electrode layer, and the second gate electrode layer located above the semiconductor layer (far side of the substrate) is called a top gate electrode layer. A first gate insulating film is provided between the bottom gate electrode layer and the semiconductor layer, and a second gate insulating film is provided between the top gate electrode layer and the semiconductor layer. The first gate insulating film and the second gate insulating film are called hereinafter a bottom gate insulating film and a top gate insulating film, respectively. According to the present invention, the bottom gate insulating film is made thicker than the top gate insulating film.

When the bottom gate electrode layer and the top gate electrode layer are electrically connected to each other, a so-called dual-gate structure is established such that a drive voltage applied to the bottom gate electrode layer is applied to the top gate electrode layer simultaneously. On the other hand, when both of the gate electrode layers are not connected directly so as not to fix the potential of the top gate electrode layer so as to be a floating state, an electric potential at the top gate electrode layer undergoes an influence of an electric potential of a conductive layer overlapped with the top gate electrode layer structurally and an electric potential of the semiconductor layer which overlaps with a top gate electrode layer structurally. Thus the electric potential at the top gate electrode layer is determined by the electric potential of the above-mentioned overlapped conductive layer and the semiconductor layer, and a coupling capacity formed between the above stated overlapped areas. When the top gate electrode layer in the floating state overlaps with the bottom gate electrode layer in a large area without overlapping with source/drain regions, in particular when the overlapping area is sufficiently large compared with an area overlapped with the semiconductor layer, an electric potential at the top gate electrode layer becomes such value close to an electric potential at the bottom gate electrode layer.

Now, the above-mentioned contents will be described in detail by referring to FIG. 1A through FIG. 1C. A lower metal wiring 1 as the bottom gate electrode layer is covered with a bottom gate insulating film 2. A semiconductor layer 3 is formed on the bottom gate insulating film 2 so as to cross a part of the lower metal wiring 1. On the semiconductor layer 3 are formed a top gate insulating film 4 and an upper metal wiring 5 as the top gate electrode layer successively. Now considering such a structure that the size of the upper metal wiring 5 is same as that of the lower metal wiring 1, and an electric potential of the lower metal wiring 1 is fixed to $V_M$, while being supposed that an electric potential of a semiconductor layer 3 is $V_{Si}$. Further considering that an electric potential of the upper metal wiring 5 is not fixed from outside so as to be so-called a floating state.

In such structure, the electric potential of the upper metal wiring 5 with a floating state is determined by both of electric potentials of the lower metal wiring 1 and the semiconductor layer 3 and capacities formed between the upper metal wiring 5 and both of the lower metal wiring 1 and the semiconductor layer 3. Assuming that the capacity formed between the upper metal wiring 5 and the semiconductor layer 3 is $C_A$, while the capacity formed between the upper metal wiring 5 and the lower metal wiring 1 is $C_B$, electric potential $V_F$ of the upper metal wiring 5 with the floating state can be represented by following equation 1.

$$V_F = [(C_A/(C_A+C_B)] \times V_{Si} + [(C_B/(C_A+C_B)] \times V_M \quad \text{(equation 1)}$$

In a TFT configuration, in many cases, considering that the semiconductor layer in a configuration shown in FIG. 1 is a channel region and its electric potential is often nearly zero volt, the above equation 1 can be approximated by following equation 2 without causing qualitative problem.

$$V_F = [(C_B/(C_A+C_B)] \times V_M \quad \text{(equation 2)}$$

As it is clear from the equation 2, when $C_B$ is sufficiently large compared with $C_A$, the electric potential $V_F$ of the upper metal wiring 5 with the floating state becomes almost same as the electric potential $V_M$ of the lower metal wiring 1.

Figure 1B:
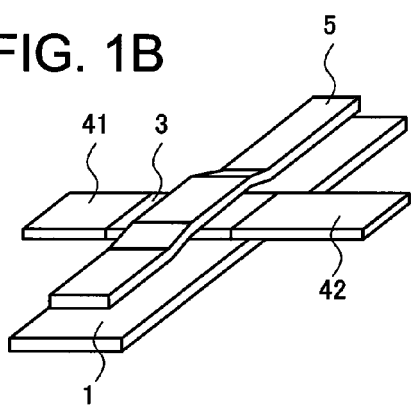
FIG. 1B is an exemplary perspective view showing the TFT configuration according to the present invention shown in FIG. 1A.
Figure 1C:
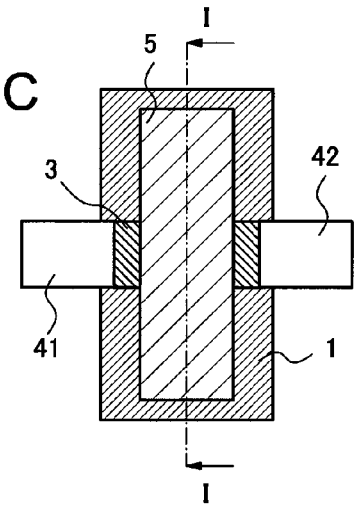
FIG. 1C is an exemplary embodiment of a plan view showing a concept of the TFT configuration according to the present invention, and a sectional view taken along a dashed line I-I shown in FIG. 1A.
Figure 1D:
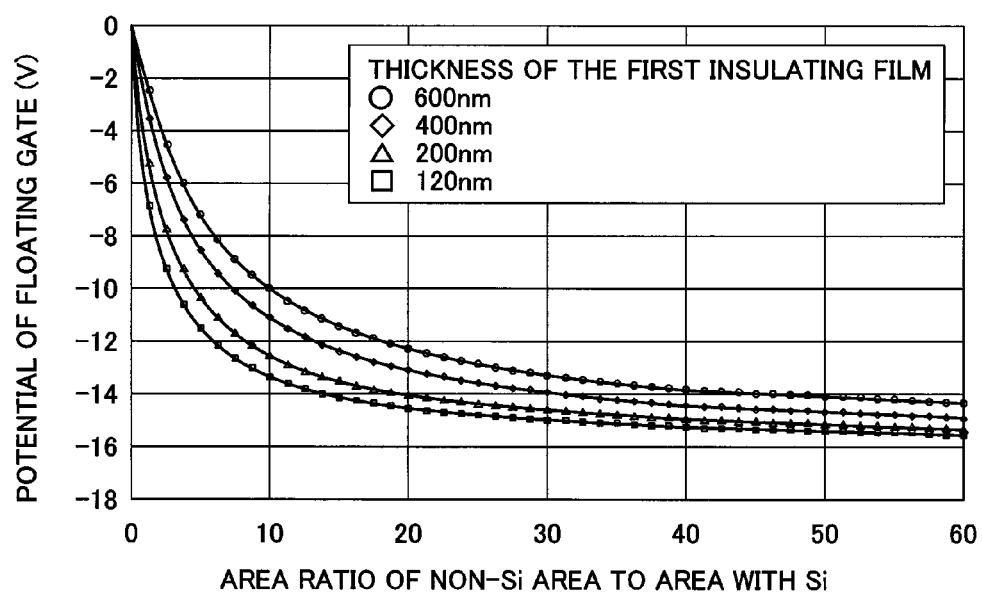
FIG. 1D is an exemplary characteristics diagram showing a relationship between electric potential of gate electrode and area ratio of non-Si area to area with Si in a TFT configuration according to the present invention.

FIG. 1D shows a potential of the floating gate or an electric potential of the upper metal wiring 5 in its longitudinal axis by varying film thickness of the gate insulating film 2 from 120 nm to 600 nm when the electric potential of the lower metal wiring 1 is fixed to −16 V and the film thickness of the gate insulating film 4 is 120 nm. A lateral axis of FIG. 1D indicates area ratio of non-Si area to area with Si, that is a ratio of a first area (dominating $C_B$) between the lower metal wiring 1 and the upper metal wiring 5 without a semiconductor layer 3 to a second area (dominating $C_A$) between the lower metal wiring 1 and the upper metal wiring 5 with a semiconductor layer 3. As it is clear from this result, when the above-mentioned area ratio exceeds 20 times, the electric potential of the upper metal wiring 5 with floating state comes close to the electric potential of the lower metal wiring 1. In an actual TFT configuration, because an electric potential of the semiconductor layer 3, i.e., electric potential of the channel region relatively comes close to the electric potential of the lower metal wiring 1 owing to affection by either the electric potential of the lower metal wiring 1 or the electric potential of a drain region, the restriction as to the above-mentioned area ratio becomes weaker than the result shown in FIG. 1D. Owing to the above-mentioned mechanism, even if a top gate electrode and a bottom gate electrode are not connected directly, the above-mentioned structure would turn out to be equivalent to the above-mentioned dual-gate structure of the related technology by satisfying the above-mentioned structural condition.

In other words, because the bottom gate insulating film is thicker than a top gate insulating film, a dual-gate characteristic due to a configuration of the present invention is dominated by top gate electrode characteristics, i.e., characteristics based on a case wherein a gate insulating film is thin. When the top gate electrode is deleted, on the other hand, TFT is dominated by a bottom gate electrode characteristics, i.e., characteristics based on a case wherein a gate insulating film is thick. Accordingly, different types of TFTs in breakdown voltage capabilities can be made on a same substrate depending on a condition of whether the top gate electrode is provided or not. Thus a low voltage TFT and a high voltage TFT can be fabricated on the same substrate easily.

Further, based on the foregoing way of thinking, it is possible to provide such a TFT configuration including a gate terminal layer provided on an insulating substrate, a first insulating layer covering the gate terminal layer, a semiconductor layer provided on the first insulating layer and including a source region and a drain region, a second insulating layer provided on the semiconductor layer, and a top gate electrode layer provided on the second insulating layer. The top gate electrode layer has a first area and a second area such that the first area is overlapped with the semiconductor layer and the second area is overlapped with the gate terminal layer without overlapping with the semiconductor layer. And it is also possible to arbitrarily select either one of different types of TFTs having different breakdown voltage capability characteristics like a case of selecting either one of the low voltage TFT or the high voltage TFT if needed.

FIG. 1B is an exemplary perspective view showing the TFT configuration according to the present invention shown in FIG. 1A. FIG. 1C is an exemplary embodiment of a plan view showing a concept of the TFT configuration according to the present invention and a sectional view taken along a dashed line I-I shown in FIG. 1C is shown in FIG. 1A. When the top gate electrode is in the floating state while only insulating material is sandwiched between the bottom gate electrode and the top gate electrode, an electric potential at the top gate electrode becomes same as an electric potential at the bottom gate electrode. As shown in FIG. 1A, when there is an area where a semiconductor layer such as a silicon layer as a channel is disposed between the top gate electrode and the bottom gate electrode, a potential at they channel also affects the floating top gate electrode, and the potential of the floating top gate electrode is determined by the above-stated area ratio. In other words, when an overlapped area of the top and bottom gate electrode layers where the channel is not disposed between them is sufficiently larger than an overlapped area of the top and bottom gate electrode layers where the channel is disposed, an electric potential at the bottom gate electrode and an electric potential at the floating top gate electrode become almost equivalent. Accordingly, a performance equivalent to a dual-gate driving can be obtained by applying a driving voltage to the bottom gate electrode.

In general, a power supplying voltage for a pixel circuit is often necessary to be at least about 10 V or more. Thus, because a relatively high voltage is applied to those TFTs used for pixel transistors and peripheral circuits, a film thickness of the gate insulating film should be formed about 100 nm or more in order to ensure its reliability. Such TFT satisfying the above mentioned requirement can generally be called a high voltage TFT.

On the one hand, TFTs used particularly for a signal processing circuit in a peripheral circuit is a TFT driven by a low voltage about 5 V or less. In recent years, because there is a tendency that such circuits are driven by much lower voltage, the film thickness of the gate insulating film should be formed with about 120 nm or less. When the TFT is driven by such power supply voltage as 3.3 V, 2.5 V or less in particular, it is desirable to make the thickness of the gate insulating film to be reduced to approximately 50 nm. Such TFT satisfying the above mentioned requirement can generally be called a low voltage TFT.

According to the present invention, however, the low voltage TFT and the high voltage TFT are not only classified by its driven voltage or breakdown voltage capability, but also classified based on relative relationship or comparison by comparing breakdown voltage capabilities of two TFTs formed on the same substrate such that the breakdown voltage capability of one TFT is lower or higher than that of the other TFT. Accordingly, in the present invention and in the following description, the high voltage TFT includes such TFT having a breakdown voltage capability higher than that of the other TFT, and the low voltage TFT includes such TFT having a breakdown voltage capability lower than that of the other TFT.

Generally, a single TFT configuration having a same breakdown voltage capability is often used for both of the high voltage TFT and the low voltage TFT by making compromise with the thickness of the gate insulating film with 100-120 nm. On the other hand, according to an exemplary embodiment of the present invention, a different TFT configurations with different breakdown voltage capabilities are provided on the same substrate as described in the following embodiments.

[Exemplary Embodiment 1]

Figure 2A:
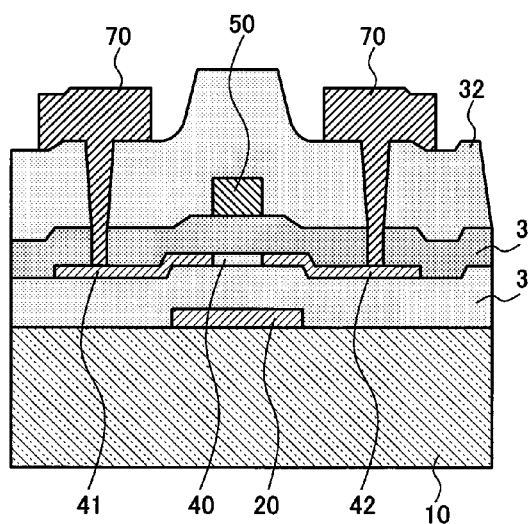
FIG. 2A is a sectional view of a low voltage TFT which is formed on a substrate according to a first exemplary embodiment of the present invention.
Figure 2B:
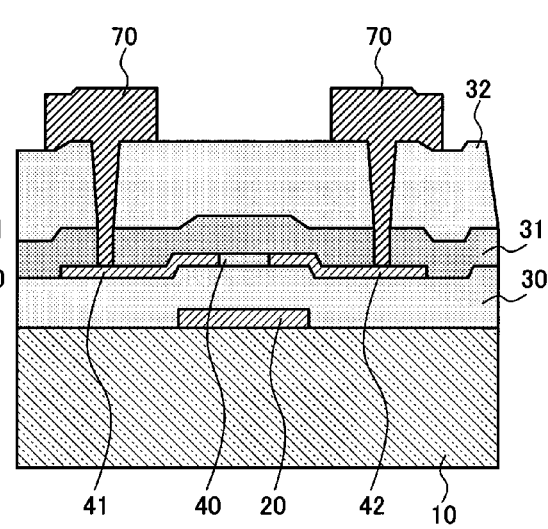
FIG. 2B is a sectional view of a high voltage TFT which is formed on a same substrate shown in FIG. 2A according to the first exemplary embodiment of the present invention.

Referring to FIG. 2A and FIG. 2B, the first exemplary embodiment of the present invention will be described wherein a first TFT having a relatively low breakdown voltage capability and a second TFT having a breakdown voltage capability higher than that of the first TFT are formed on the same substrate for providing a TFT circuitry substrate.

As shown in FIG. 2A and FIG. 2B, each bottom gate electrode 20 is formed on a first TFT area and a second TFT area of a common insulating substrate 10, respectively, and a bottom gate insulating film 30 is formed commonly on the bottom gate electrode 20. The bottom gate insulating film 30 is made relatively thick so as to correspond to a driving voltage applied to the second TFT. Each semiconductor layer 40 is formed on the bottom gate insulating film 30 such that a source region 41 and a drain region 42 are provided for both TFTs, respectively. Then a top gate insulating film 31 is formed to cover the semiconductor layer 40. The top gate insulating film 31 is made relatively thin so as to drive the first TFT at relatively lower voltage which is lower than the driving voltage applied to the second TFT. Thus the top gate insulating film 31 is made thinner than the bottom gate insulating film 30. As shown in FIG. 2A and FIG. 2B, the foregoing structural components are common for both TFTs.

As shown in FIG. 2A, a top gate electrode 50 is provided on the top gate insulating film 31 only for the first TFT having a breakdown voltage capability lower than that of the second TFT. On the other hand, as shown in FIG. 2B, the top gate electrode is not provided on the top gate insulating film 31 for the second TFT having the breakdown voltage capability higher than that of the first TFT. An interlayer insulating film 32 is formed commonly for both TFTs, and source/drain electrode wirings 70 are provided so as to be connected to the source region 41 and the drain region 42 via contact holes, respectively.

In this way, the first TFT configuration and the second TFT configuration with different breakdown voltage capabilities can be formed easily on the same substrate. By satisfying the condition of the present invention described with reference to FIG. 1, the first TFT shown in FIG. 2A is ruled by the top gate electrode 50 formed on the top gate insulating film 31 which is thinner than the bottom gate insulating film 30. On the other hand, because the second TFT shown in FIG. 2B is ruled by the bottom gate electrode 20 disposed under the bottom gate insulating film 30 which is thicker than the top gate insulating film 31, the breakdown voltage capability of the second TFT becomes higher than that of the first TFT.

Accordingly, by making the thickness of the insulating film for the bottom gate electrode larger than that of the insulating film for the top gate electrode, and by providing the top gate electrode, a dual-gate structure or equivalent structure can be established for the first TFT which can be driven by the top gate electrode. On the other hand, when the top gate electrode is not provided or deleted, the second TFT driven by the bottom gate electrode is established, and the breakdown voltage capability of the second TFT can be made higher than that of the first TFT.

Therefore, the above-mentioned combination of the first TFT and the second TFT is not limited to such a combination of the low voltage TFT and the high voltage TFT which are generally called but can be applied to such combination that the first TFT with the top gate electrode used for pixel electrode and the second TFT without the top gate electrode used for much higher voltage TFT having much higher breakdown voltage capability compared with the TFT used for pixel electrode on the same substrate in other areas. Thus two kinds of TFTs with different breakdown voltage capabilities can be formed easily on the same substrate by deciding weather the top gate electrode is provided or not.

Figure 3A:
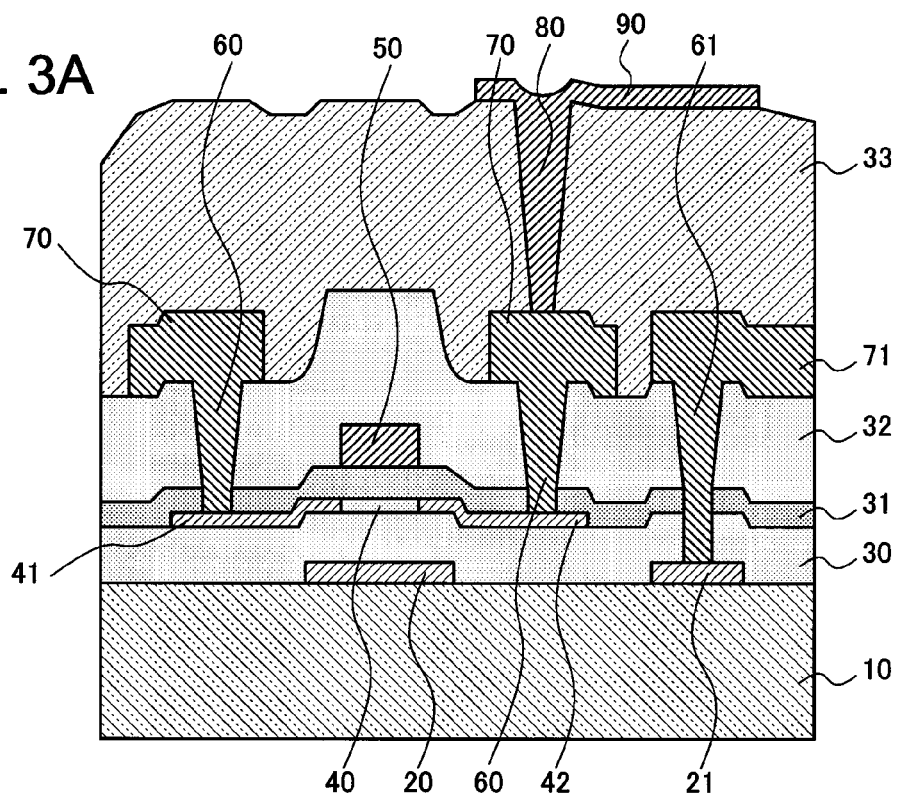
FIG. 3A is a sectional view of a TFT configuration according to the first exemplary embodiment of the present invention.

In a following description, referring to FIG. 3A, it is described in detail about a TFT configuration together with a manufacturing method in a case of applying the first TFT shown in FIG. 2A to TFT for pixels.

A bottom gate electrode 20 made of Cr is formed on a transparent substrate 10 made of a glass or a quartz. An electrode 21 is a part of a layer of the bottom gate electrode 20 formed on the same layer to be connected with the bottom gate electrode 20 at a different section not shown. Further, an insulating film which aims at preventing a spread of a contaminant from a substrate material may be formed between the bottom gate electrode 20 and the substrate 10. The bottom gate electrode 20 may be made of either one of other metals such as Mo, W, Ti, Nb and Al, or those alloys of those metals, or a laminated structure of those, or a silicon compound of those. The film thickness of the bottom gate electrode 20 needs to be made thick enough so as not to penetrate an optical light through it with sufficiently low electric resistance. On the other hand, its thickness should be limited so as to be covered sufficiently with the bottom gate insulating film. Accordingly, it is desirable to make the thickness of the bottom gate electrode 20 within a range from 20 nm to 400 nm.

Next, the bottom gate insulating film 30 made of $SiO_2$ is formed on the bottom gate electrode 20. The material of the bottom gate insulating film 30 is not limited to $SiO_2$, but either one of TaO, SiON, SiN or a laminated film of $SiO_2$ and SiN can be used. When a low alkali glass or a soda lime glass is used as a substrate material, which contains impurities to some extent, an oxide layer such as $SiO_2$, or SiN layer or a laminated layer of SiO/SiN may be provided appropriately between the substrate and the bottom gate electrode. As for the film thickness of the bottom gate insulating film 30, it is desirable to be made relatively thick so as to correspond to the value of the voltage which is applied to a TFT driven by a voltage higher than that applied to a TFT for pixels. As an example of trial manufacturing, the bottom gate insulating film 30 is formed by changing its thickness with 120 nm, 200 nm, 400 nm and 600 nm.

Next, a semiconductor layer such as a silicon layer 40 with a film thickness of about 50 nm is deposited by using a CVD (Chemical Vapor Deposition), and after performing a channel injection, applying ELA (Excimer Laser Annealing) for crystallization by using an excimer laser and thereby forming a polycrystalline silicon thin film. After that, the silicon layer 40 is patterned into an island shape. When the thickness of the bottom gate insulating film 30 is 120 nm, it is easy for a heat to escape from the bottom gate electrode during a laser crystallization process, and it turns out that a crystallization rate is different depending on existence or nonexistence of the bottom gate electrode. Therefore, it is desirable to make the film thickness of the bottom gate insulating film 30 to be more than or equal to 200 nm.

Next, the top gate insulating film 31 is formed by using $SiO_2$. The material of the top gate insulating film 31 is not limited to $SiO_2$, but either one of TaO, SiON, SiN or a laminated film of $SiO_2$ and SiN can be used. As for the film thickness of the top gate insulating film 31, it is desirable to form it relatively thin in order to drive the TFT with a relatively low voltage, at least thinner than the bottom gate insulating film 30. In this exemplary embodiment, the top gate insulating film 31 is made to have the thickness of 120 nm. Instead of decreasing the thickness of the top gate insulating film 31, it is possible to make the insulating film capacity per unit area of the top gate insulating film 31 to be larger than that of the bottom gate insulating film 30. Because the insulating capacity can be controlled by the film thickness of the insulating film and a dielectric constant of the insulating film, it is desirable to use a high dielectric constant material such as TaO so as to be made thin in order to obtain higher driving ability for top gate electrode characteristics.

Next, a top gate electrode 50 is formed by using Cr. Similar to bottom gate electrode 20, the top gate electrode 50 may be made of either one of other metals such as Mo, W, Ti, Nb and Al, or those alloys of those metals, or a laminated structure of those. The bottom gate electrode 20 and the top gate electrode 50 do not need to be made of the same material.

Next, by using the top gate electrode 50 as a mask, N type impurity such as phosphorus or P type impurity such as boron is injected into the silicon layer 40 with high concentration to form a source region 41 and a drain region 42. The source and drain regions may be formed prior to providing the top gate electrode 50 by injecting N type or P type impurity with high concentration into outside regions extending from ends of the top gate electrode to predetermined length to form the source and drain regions, and after providing the top gate electrode 50, LDD (Lightly Doped Drain) regions can be formed by injecting N type or P type impurity with low concentration by using the top gate electrode 50 as a mask. In this case, the length of the above-mentioned predetermined length is an LDD length.

A relatively low voltage TFT can be made by remaining the top gate electrode 50 employed as the mask while a relatively high voltage TFT can be made by removing the top gate electrode as shown in FIG. 2B by etching. In this way, different types of TFTs driven at different voltages can be formed easily on the same substrate.

The following method can also be adopted as another method to form a high voltage TFT and a low voltage TFT on the same substrate.

Forming source/drain regions by injecting N type or P type impurity with high concentration into the semiconductor layer at outside regions extending from ends of the top gate electrode to predetermined length. After forming a top gate electrode only on an area supposed to become a low voltage TFT and covering an entire area with a resist film. After that, selected portions of the resist film corresponding to necessary portions such as the top gate electrode region and its vicinity region, and in the vicinity of a drain edge of the high voltage TFT if needed, are removed to provide openings in the resist film. And then the LDD regions in the low voltage TFT are formed by using the top gate electrode 50 as a mask while the LDD regions in the high voltage TFT are formed by using the resist film as a mask by slightly injecting the N type or P type impurity into the semiconductor layer.

When the LDD regions are unnecessary, it is possible to form the source/drain regions at predetermined outside areas extended from the edges of the top gate electrode for the low voltage TFT and predetermined area of the high voltage TFT by injecting the N type or P type impurity into the semiconductor layer with high concentration.

Next, a first interlayer insulating film 32 is formed with either one of $SiO_2$, SiN or a lamination of $SiO_2$ and SiN, and then contact holes 60 and 61 are opened for the source/drain electrode wirings 70 and an electrode wiring 71, respectively. The contact holes 60 are provided so that the source/drain electrode wirings 70 are connected to the source region 41 and the drain region 42 of the silicon layer, respectively, while the contact hole 61 is provided so that the electrode wiring 71 is connected to the electrode 21 which is formed on the same layer of the bottom gate electrode 20. Because the contact holes 60 and the contact hole 71 have different depth, etching selectivity rate of the insulating layer to the silicon needs to be made large at the time of opening the contact holes 60 and 61. When the above-mentioned etch selectivity rate is not large enough, such trouble would occur that an etching of the silicon layer would progresses at a contact hole 60 prior to opening the contact hole 61, and in the worst case, the silicon layer would be over-etched and penetrated and thus an appropriate contact would be destroyed.

Figure 3B:
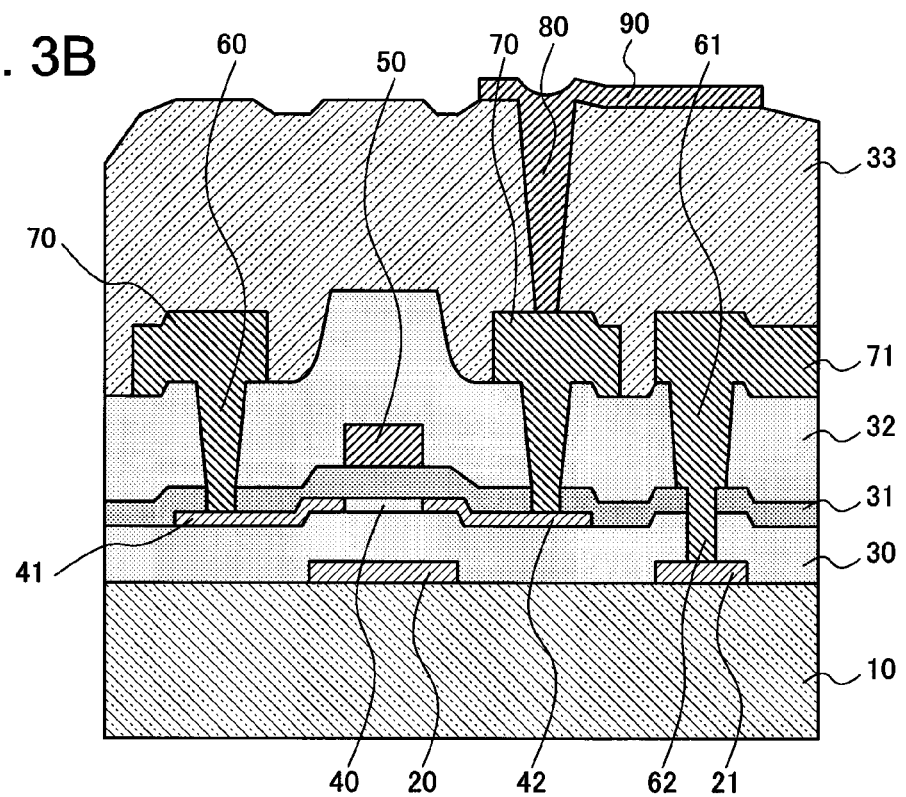
FIG. 3B is a sectional view showing a partially modified configuration of the TFT configuration shown in FIG. 3A.

To this end, it is possible to avoid the above-mentioned over-etching problem by opening a contact hole 62, prior to forming the top gate electrode 50 as shown in FIG. 3B.

Figure 4:
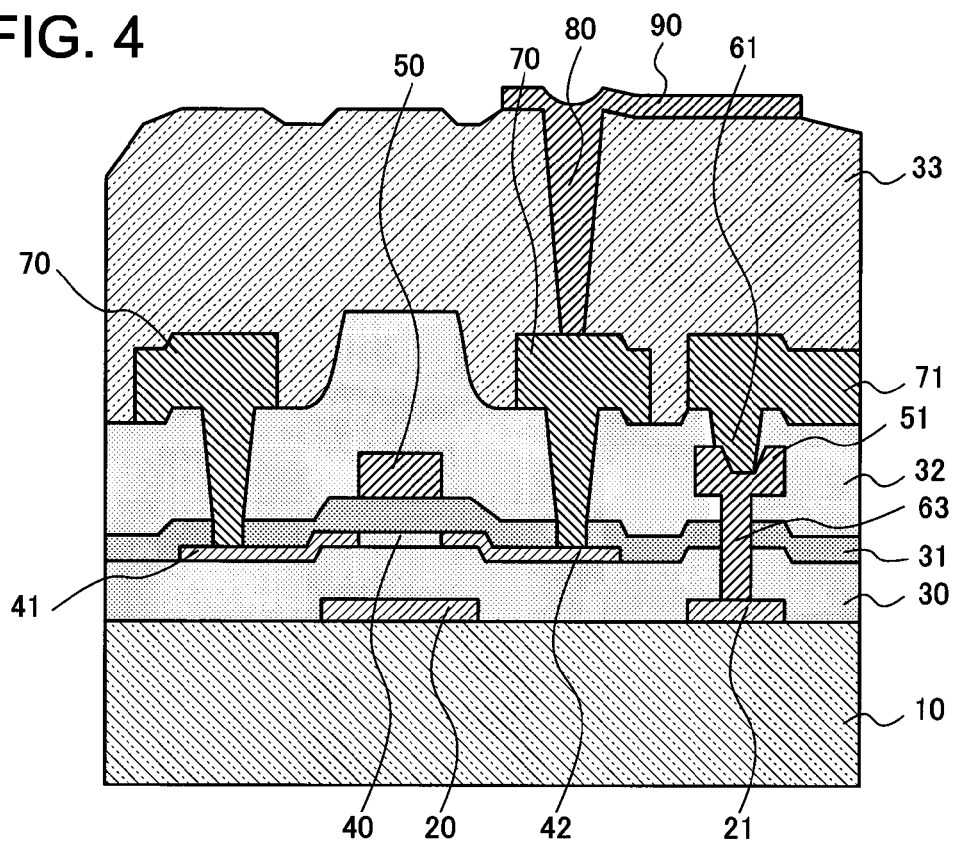
FIG. 4 is a sectional view of a TFT configuration according to the first exemplary embodiment of the present invention.

The contact hole 62 can be opened prior to forming the top gate insulating film 31. As shown in FIG. 3B, when an opening process for the contact hole is carried out prior to forming the top gate electrode 50, it is possible to use a method of forming an electrode 51 which is formed on the same layer of the top gate electrode 50 at the time of forming the top gate electrode after opening a contact hole 63 as shown in FIG. 4. The top gate electrode 50 and the electrode 21 can be made to have the same electric potential by electrically connecting the top gate electrode 50 and the electrode 51 by forming them with continuous wiring layer. In addition to that, because the electrode 21 and the bottom gate electrode 20 are electrically connected each other as previously mentioned, the top gate electrode 50 and the bottom gate electrode 20 have the same electric potential. In other words, when the TFT is driven by using the bottom gate electrode disposed under the silicon layer, the top gate electrode located above the silicon layer is also driven simultaneously and thus a dual-gate structure can be obtained.

Next, the second interlayer insulating film 33 is formed with SiN to protect a TFT configuration and thereby forming a transistor circuitry substrate. When this TFT is employed as a transistor for pixel, an additional contact hole 80 is opened to be connected to a transparent pixel electrode 90 which is made of an indium tin oxide (ITO). In an area besides the pixel, the transparent pixel electrode 90 does not need to be a transparent electrode.

According to the above-mentioned exemplary embodiment of the present invention, both transistors of the low voltage TFT and the high voltage TFT can be driven using a bottom gate electrode or a lower layer conductive layer. As described before, since the top gate electrode does not exist for the high voltage TFT, a characteristics ruled by the gate insulating film (it is formed relatively thick) against the bottom gate electrode is obtained, and a transistor with a high reliability can also be obtained in a high voltage operation.

As for the low voltage TFT, the top gate electrode is provided so as to satisfy the above mentioned condition. In this case, a characteristics equivalent to drive both of the top gate electrode and the bottom gate electrode simultaneously is obtained, and a characteristic ruled by the gate insulating film (it is formed relatively thin) against the top gate electrode is obtained, and thus a high-speed driving with a high current drive capability is possible.

In other words, by a presence of the top gate electrode layer which satisfies the above mentioned condition, it is possible to selectively fabricate the low voltage TFT driven at high speed and the high voltage TFT with high breakdown voltage capability on a common TFT substrate.

In recent years, on the other hand, because an aperture ratio of a pixel tends to decrease due to a display resolution improvement and functional sophistication, brightness of a backlight should be increased for compensation. In the TFT configuration shown in the above-mentioned Patent Document 1, because a light from an outside such as a backlight enters the silicon layer of the TFT, electron and hole pairs are generated in the silicon layer. In particular, because the electrons or holes generated around a boundary area between the channel and the drain partly flows into the drain region as a leak current by an electric field, they are detected as a drain current. In other words, there occurs a problem of a so-called optical leak current caused by increase of an off-leak current owing to a light irradiation. As a result, owing to decrease of voltage written in a pixel storage capacity or pixel capacity, there exist problems such as contrast decrease, defects of bright or dark spots or the like and an erroneous operation in a gate line driving circuit or the like.

However, according to the above-mentioned exemplary embodiment of the present invention, because the bottom gate electrode is formed so as to be overlapped with the source/drain regions which are high concentration impurity injected areas in the semiconductor layer, the bottom gate electrode has a function to interrupt the external light which enters around the boundary area between the channel and the drain, and thereby enabling to cancel the problem of the above-mentioned optical leak current.

In the followings, about the operation of the TFT structures shown in FIG. 2, FIG. 3 and FIG. 4 are described in detail. In a configuration shown in FIG. 4, when the top gate electrode 50 and the electrode 51 formed at the same layer of the top gate electrode 50 are connected electrically to each other, a dual-gate structure is established. Because the top gate insulating film 31 is thin compared with the bottom gate insulating film 30, characteristics of the TFT is ruled by characteristics associated with the top gate electrode. When the top gate electrode 50 does not exist, on the other hand, the TFT characteristics will be dominated by bottom gate electrode characteristics. Therefore, resorting to the condition of with or without of the top gate electrode, two different characteristics can be made and separated easily. Specifically, when the top gate electrode 50 exits, the low voltage TFT with the high current drive capacity is obtained, while the top gate electrodes 50 does not exist, the high voltage TFT with a large gate breakdown voltage is obtained.

In a structure shown in FIG. 4, even if the top gate electrode 50 and the electrode 51 formed on the same layer are not connected electrically, and the top gate electrode 50 is a floating state like a structure shown in FIG. 2 and FIG. 3, the same effect of the above-mentioned dual-gate effect can be obtained in the following conditions as already mentioned previously.

That is, concerning those areas between the bottom gate electrode and the top gate electrode, when an area where a channel is not disposed compared with an area where a channel is disposed is large sufficiently, an electric potential at the bottom gate electrode and an electric potential at the top gate electrode of a floating become almost equivalent, and thus equivalent performance of a dual-gate driving can be obtained by driving the bottom gate electrode.

Figure 5:
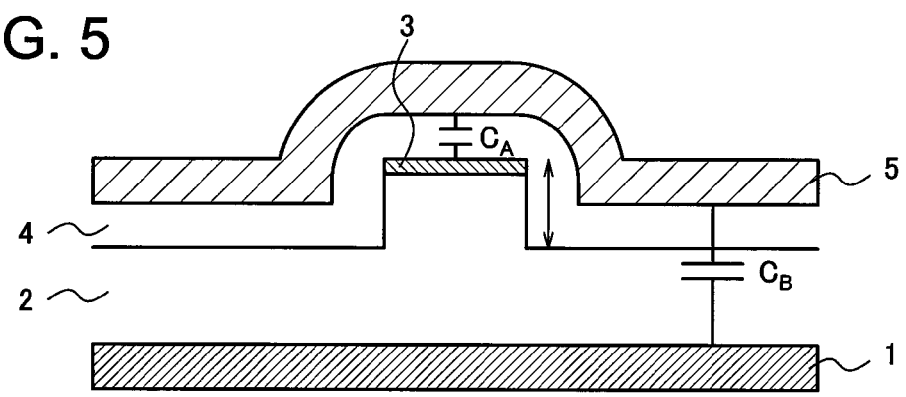
FIG. 5 is a sectional view showing a typical modification of a concept of a TFT configuration according to the first exemplary embodiment of the present invention.

Because the desirable area ratio of the area where the channel is disposed and the area which is not disposed is decreased when the distance between the bottom gate electrode and the top gate electrode decreases at an area where a channel is not disposed, it is more desirable to have a configuration as shown in FIG. 5. In other words, it is more desirable that the sum of the thickness of the bottom gate insulating film 30 and the thickness of the top gate insulating film 31 at the area where a channel is not disposed between the bottom gate electrode and the top gate electrode is smaller than the sum of the thickness of the bottom gate insulating film 30 and the thickness of the top gate insulating film 31 at the area where a channel is disposed between the bottom gate electrode and the top gate electrode. Such configuration shown in FIG. 5 can be formed easily by increasing etching amount during the process of forming the island of the silicon layer.

In FIG. 2, FIG. 3 and FIG. 4, because the electrical potential of the floating top gate electrode is affected by a source/drain potential when at least part of the source/drain electrode wirings 70 are overlapped with the top gate electrode 50, it is desirable that the source/drain electrode wirings do not overlap with the top gate electrode as much as possible.

TFTs having the above-mentioned configurations are made, and measured characteristics of the TFTs are shown in FIG. 6. The thickness of the bottom gate insulating film of this configuration is 600 nm, and the thickness of the top gate insulating film is 120 nm, and in a configuration with a top gate electrode, the area where only the insulating film is disposed between the top gate electrode and the bottom gate electrode is selected to be eight times of the channel area.

Figure 6A:
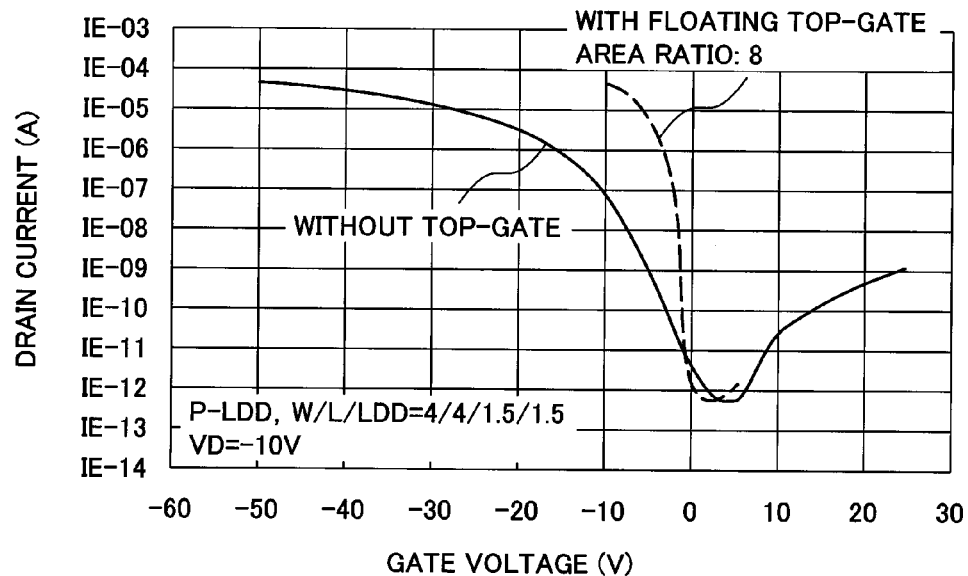
FIG. 6A is a characteristics diagram showing a difference in TFT characteristics with a floating top gate or without top gate.

In FIG. 6A, a horizontal axis indicates voltages applied to the bottom gate electrode and a vertical axis indicates drain currents, and it is indicated that two different characteristics can be made and separated clearly by existence or nonexistence of the floating top gate electrode. In other words, the TFT characteristics without the top gate electrode is obtained from such characteristics derived from the thick film thickness of the bottom gate insulating film, and thus the high voltage TFT with the high gate breakdown voltage can be obtained. On the other hand, the TFT characteristics with the top gate electrode is obtained from such characteristics derived from the film thickness of the top gate insulating film, and thus the low voltage TFT with the high current drive capability can be obtained.

Figure 6B:
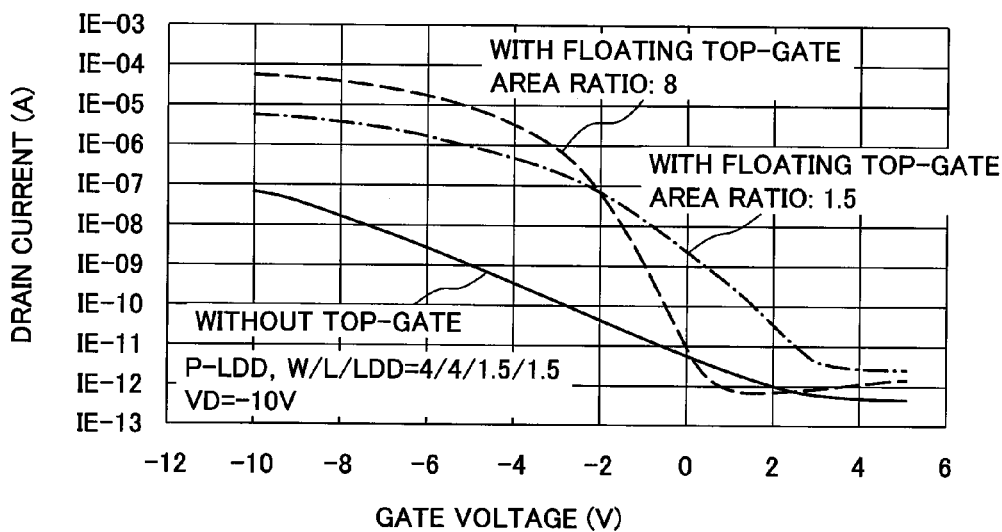
FIG. 6B is a characteristics diagram showing a difference in TFT characteristics by varying area ratio.

In FIG. 6B, changes of drain currents are shown when the ratio of the area where only the insulating material is disposed between the top gate electrode and the bottom gate electrode to the channel area is changed. In the case of the above-mentioned area ratio is about 1.5, it is indicated that such TFT is not sufficient in view of the high current drive capability. When the above-mentioned area ratio is more than or equal to eight, the high current drive capacity can be obtained sufficiently as indicated previously. FIG. 1D also suggest that the above-mentioned area ratio is desirable to be large, and it is desirable that the above-mentioned area ratio is more than or equal to 20.

[Exemplary Embodiment 2]

In the first exemplary embodiment mentioned above, although a case when the source/drain electrode wirings 70 are located above the top gate electrode is indicated, the second exemplary embodiment shown in FIG. 7 has a configuration such that the source/drain electrode wirings 70 are located below the top gate electrode. That is, according to the second exemplary embodiment, the source/drain electrode wirings 70 are formed prior to forming the top gate insulating film 31. By this method, a process needed to form the contact holes 60 shown in the configuration of FIG. 2 can be omitted. A contact hole 160 is formed instead of a contact hole 61 shown in FIG. 2 so that the electrode 21 formed on the same layer of the bottom gate electrode 20 is connected to the contact hole 160. That is, an opening for the contact hole 160 is formed into both of the bottom gate insulating film 30 and the top gate insulating film 31 prior to forming the top gate electrode 50. And thus the top gate electrode 50 and the electrode 51 formed on the same layer of the top gate electrode 50 are formed. As for the restricted condition about other manufacturing methods and configurations is same as the first exemplary embodiment, and the obtainable advantages are also same as the first exemplary embodiment.

Figure 7:
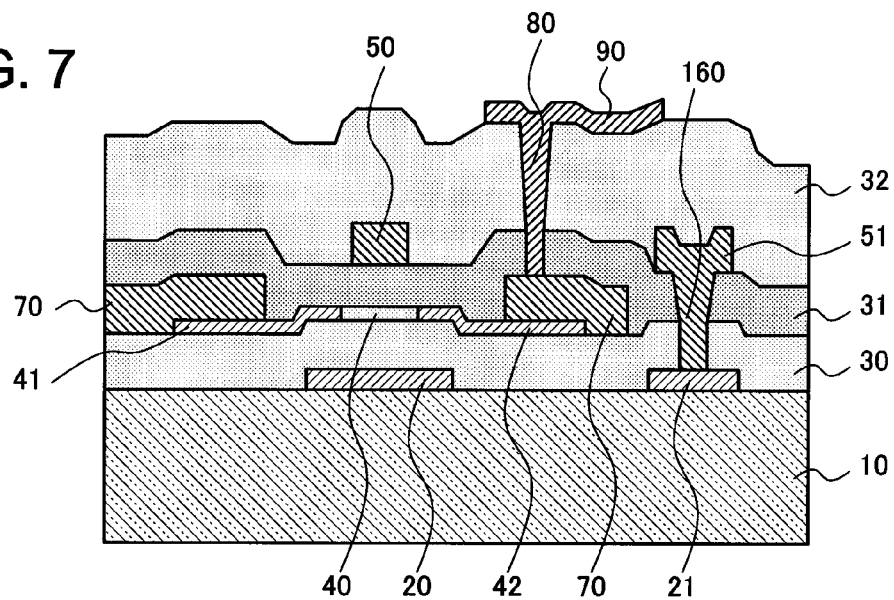
FIG. 7 is a sectional view of a TFT configuration according to a second exemplary embodiment of the present invention.
Figure 8:
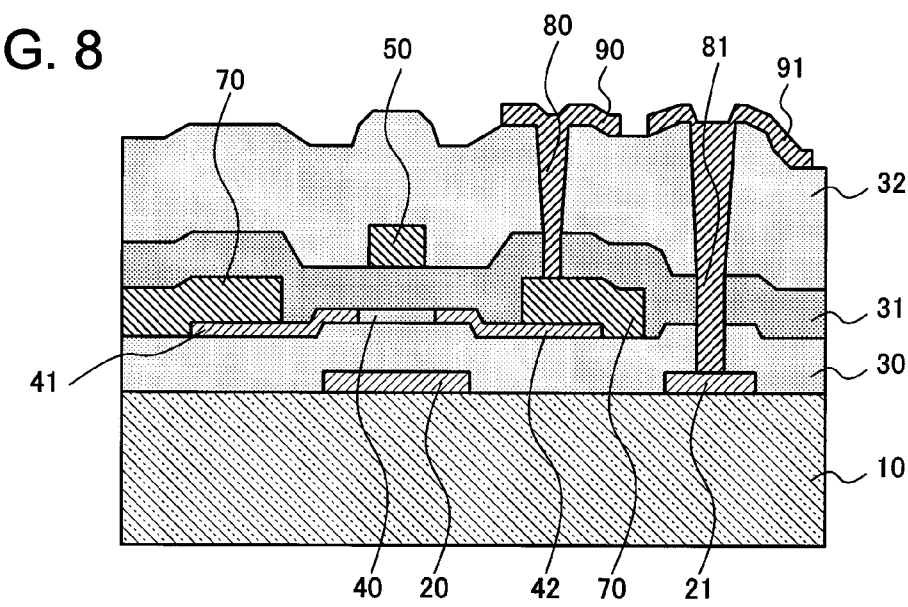
FIG. 8 is a sectional view of a TFT configuration according to the second exemplary embodiment of the present invention.

As an example of modification of FIG. 7, a contact hole 81 for contacting the electrode 21 may be simultaneously opened as shown in FIG. 8 when a contact hole 80 is opened after forming the first interlayer insulating film 32 without forming a contact hole 160. In this case, an electrode 91 contacted to the electrode 21 should be formed simultaneously with the transparent pixel electrode 90. In an area besides the pixel, the material of the pixel electrode 90 and the electrode 91 is not necessary to, be a transparent electrode material.

[Exemplary Embodiment 3]

Figures 11A, 11B:
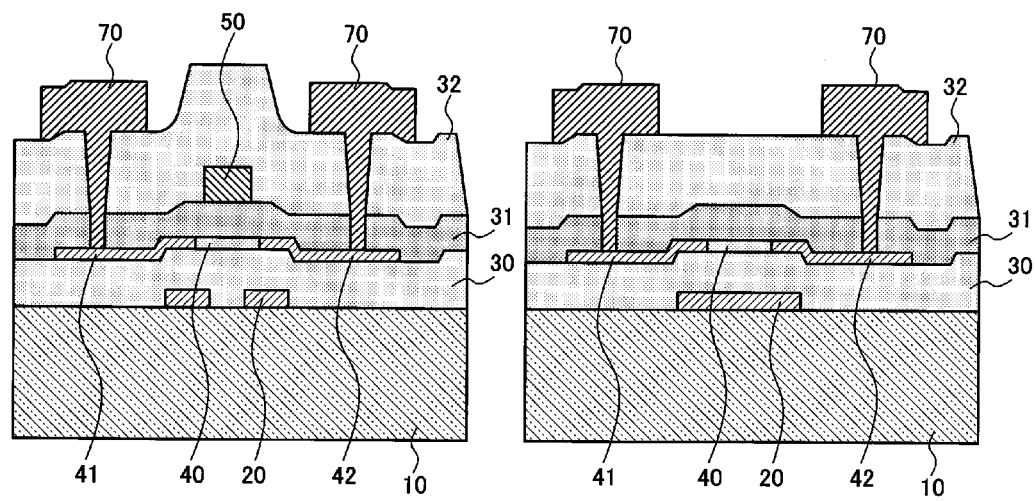
FIG. 11A is a sectional view of a low voltage TFT which is formed on a substrate according to a third exemplary embodiment of the present invention having a multi-gate configuration associated with the first exemplary embodiment.
FIG. 11B is a sectional view of a high voltage TFT which is formed on a same substrate shown in FIG. 11A according to the third exemplary embodiment of the present invention.
Figures 12A, 12B:
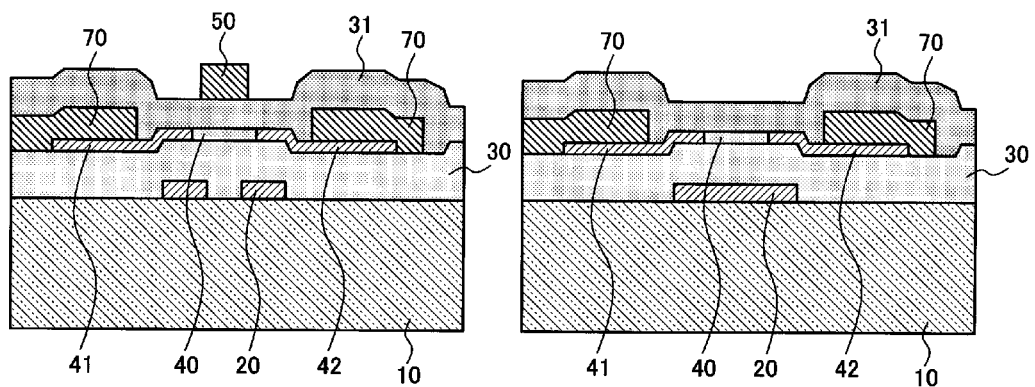
FIG. 12A is a sectional view of a low voltage TFT which is formed on a substrate according to a third exemplary embodiment of the present invention having the multi-gate configuration associated with the second exemplary embodiment.
FIG. 12B is a sectional view of a high voltage TFT which is formed on a same substrate shown in FIG. 12A according to the third exemplary embodiment of the present invention.

In the third exemplary embodiment of the present invention, it is described about a configuration which applied the present invention to TFT having offset configurations. As shown in FIG. 9 through FIG. 13, it is possible to provide both TFTs of the low voltage TFT and the high voltage TFT on the same substrate easily and simultaneously. In FIG. 9 and FIG. 10, one example in accordance with the first exemplary embodiment and another example in accordance with the second exemplary embodiment are indicated, respectively, and thereby showing a TFT substrate with the combination structure of the low voltage TFT (or high current driving TFT) and the high voltage TFT (or high breakdown voltage capability TFT) on the same substrate, and either one of such configurations can be adopted appropriately for the TFT substrate circuitry. In the same manner, FIG. 11 and FIG. 12 show two examples, respectively. One example shown in FIG. 11A and FIG. 11B is associated with the first exemplary embodiment and another example shown in FIG. 12A and FIG. 12B is associated with the second exemplary embodiment.

In these embodiments, however, the following attention may be needed. Because the top gate electrode does not exist at the high voltage TFT, when there is an impurity-injection step using a top gate electrode as a mask in a manufacturing process, impurities are unintentionally injected into a channel region of the high voltage TFT. In order to avoid such unintentional injection of impurities, a photoresist layer is used as a mask rather than using the top gate electrode as a mask. In this case, because both steps of a high concentration injection of impurities for the source/drain regions and a low concentration injection of impurities for the LDD regions require using the photoresist as mask, it is inevitable to increase the number of manufacturing steps. In order to suppress the increase of the manufacturing steps for such LDD regions, manufacturing process are carried out in a following manner.

In a configuration indicated in the first exemplary embodiment, when forming the source region 41 and the drain region 42 by injecting an impurity of N type or P type with high concentration prior to forming the top gate electrode 50, the source/drain regions are formed by injecting an impurity of N type or P type with low concentration at outside, regions extended from a predetermined length from edges of the top gate electrode. In this case, as shown in FIG. 9 through FIG. 13, the bottom gate electrode 20 is formed such that it may be overlapped with all areas of the above-mentioned predetermined length.

In this exemplary embodiment, different from the first and second exemplary embodiments, the LDD regions are not formed and thereby eliminating the step of injecting an impurity of N type or P type with low concentration by using the top gate electrode as a mask. In other words, the areas of the predetermined length will be offset regions. Because all these offset regions are overlapped with the bottom gate electrode via the bottom gate insulating film, the offset regions has a function equivalent to the LDD regions due to the influence of the electric potential at the bottom gate electrode. In other words, because the offset regions has a high-resistance to, a problem that a turn-on current becomes small when there are no bottom gate electrode overlapped with the offset regions, but this problem can be canceled by the influence of the electric potential at the bottom gate electrode. Therefore, by using this technique, the LDD formation process can be eliminated and thereby enabling the reduction of the manufacturing steps.

In a TFT substrate provided with the low voltage TFT and the high voltage TFT, characteristics of the high voltage TFT are characteristics itself resorting to a bottom gate electrode, and the low voltage TFT characteristics is ruled by characteristics driven by the top gate electrode secondarily. In other words, when the top gate electrode is a floating state, the role of the bottom gate electrode in the low voltage TFT is to control a floating electric potential by using the bottom gate electrode, and thus it does not require controlling a channel region like a general gate electrode necessarily. Therefore, in order to form the low voltage TFT aiming at a high current driving, the area size sandwiched between the bottom gate electrode and the top gate electrode without including a channel region should be made sufficient enough, and as will be described later referring other exemplary embodiment, the bottom gate electrode does not need to be overlapped with the channel region necessarily.

However, it is desirable that the bottom gate electrode overlaps with the offset regions in view of following two points.

The first viewpoint is that, in a TFT with offset regions, a case that the offset regions have the function equivalent to the LDD regions due to influence of electric potential at the bottom gate electrode by overlapping the bottom gate electrode with entire offset regions.

The second viewpoint is that the bottom gate electrode has useful function to suppress an optical leak current by interrupting a light of a backlight to enter the silicon layer. It is widely known that since a main cause of the optical leak current is a light entering those area such as a boundary section (or junction area) of the channel region and the drain region, the LDD regions, and the offset regions, it is important to optically interrupt the above-mentioned areas. Thus the above-mentioned bottom gate electrode gives the sufficient effect for a suppression of the optical leak current. In view of above-mentioned two viewpoints, in the low voltage TFT, it is desirable to arrange the bottom gate electrode so as to be overlapped with the LDD regions or the offset regions as shown in FIG. 11 and FIG. 12.

Figure 13A:
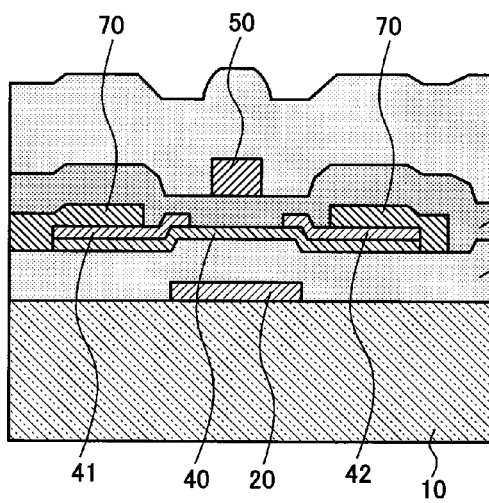
FIG. 13A is a sectional view of a low voltage TFT which is formed on a substrate according to a modified example of the third exemplary embodiment of the present invention.
Figure 13B:
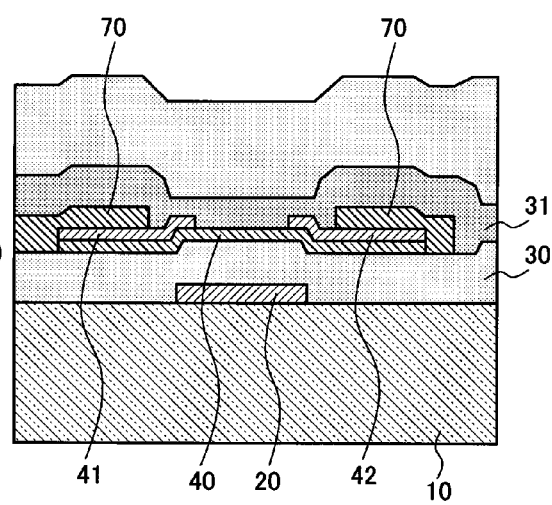
FIG. 13B is a sectional view of a high voltage TFT which is formed on a same substrate shown in FIG. 13A according to the modified example of the third exemplary embodiment of the present invention.

Although the embodiments described in the first and the second exemplary embodiments relates to TFTs using polycrystalline silicon for the semiconductor layer, the present invention is not limited to such polycrystalline silicon as a silicon thin film, but the present invention is a technology which can be applied to such TFT using amorphous silicon. In the following, a TFT structure using the amorphous silicon is explained. That is, the silicon layer used in the TFT configuration shown in FIG. 9 through FIG. 12 may be replaced by the amorphous silicon layer. Or as shown in FIG. 13, it may be produced by a manner close to the manufacturing method of amorphous silicon TFT of the Patent Document 1. Specifically, like the previous embodiment, forming a gate electrode on a glass substrate and forming the bottom gate insulating film, and then after forming an amorphous silicon layer, amorphous silicon highly doped with an N type impurities (e.g., phosphorus) may be formed as a source region 41 and a drain region 42. As for the other configurations and its manufacturing method, they are same as the cases shown in FIG. 9 through FIG. 12.

In any embodiments described in the first to third exemplary embodiments, it is desirable to make the capacity $C_B$ formed between the upper metal wiring 5 and the lower metal wiring 1 as large as possible as shown in FIG. 1. In order to realize this, it is also effective to adopt a ground engraving structure shown in FIG. 5 other than the method to make the area where the semiconductor layer such as a silicon layer is not exist between the bottom gate electrode and the top gate electrode as large as possible as already described. In other words, because the ratio of the volume of capacity $C_B$ to the capacity $C_A$ between the upper metal wiring 5 and the semiconductor layer 3 can be made large relatively by making the thickness of the insulating film between the bottom gate electrode and the top gate electrode in an area without the semiconductor layer thinner than the thickness of the insulating film between the bottom gate electrode 1 and the top gate electrode 5 in an area with a semiconductor layer in the ground engraving structure, equivalent effect of increasing the area where the semiconductor layer is not exist between the bottom gate electrode and the top gate electrode is obtained.

An island of semiconductor such as silicon is generally formed by using a photolithography process. This configuration can be obtained easily by deeply etching an insulating film 2 (the bottom gate insulating film) at the time of etching the semiconductor layer, and then forming the top gate insulating film 4 and the top gate electrode. Although it is desirable to etch the bottom gate insulating film so that the bottom gate electrode exposes during etching the semiconductor, a certain amount of effect can be obtained even slightly etching the bottom gate insulating film.

[Exemplary Embodiment 4]

Figure 14A:
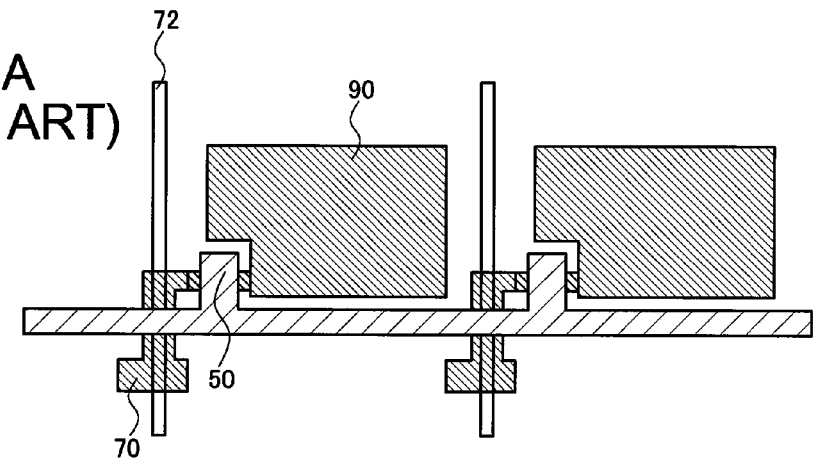
FIG. 14A is a plan view showing a pixel array structure associated with a related technology.
Figure 14B:
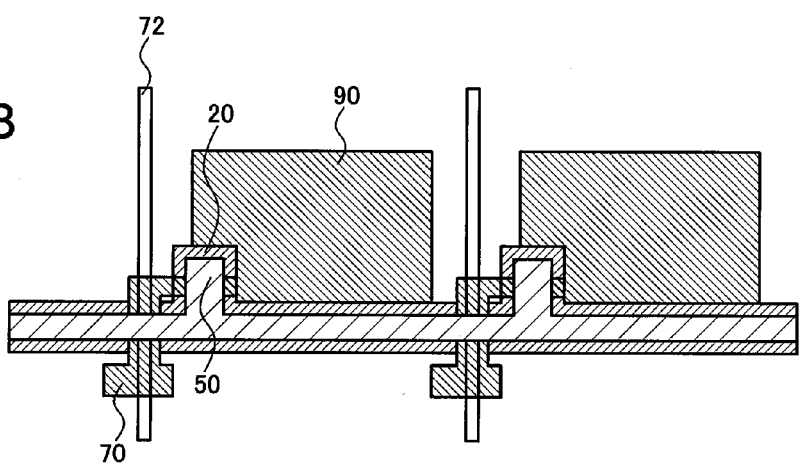
FIG. 14B is a plan view showing a pixel array structure according to a fourth exemplary embodiment of the present invention.
Figure 14C:
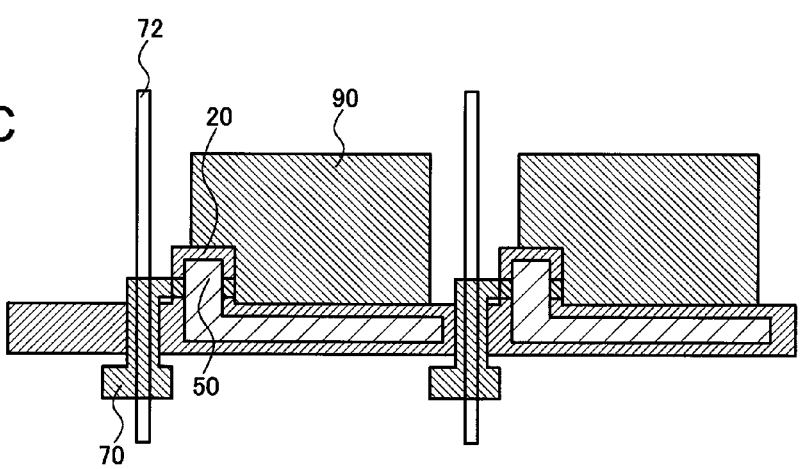
FIG. 14C is a plan view showing a pixel array structure according to a modified example of the fourth exemplary embodiment of the present invention.

In the following, it is described about a method to apply the bottom gate driving TFT provided with a floating top gate electrode indicated in the first to third exemplary embodiments to a pixel array. FIG. 14A shows an array structure of pixel electrodes 90 together with conventional TFT array which is often generally used in a TFT substrate for a liquid crystal display panel, and FIG. 14B and FIG. 14C show an array structure of pixel electrodes 90 with TFT array according to the exemplary embodiment of the present invention. In a pixel array structure shown in FIG. 14B, by which a data line 72 is connected with source/drain electrode wirings 70, a wiring of the top gate electrode 50 is formed so that it may be overlapped with the wiring of the bottom gate electrode 20. In FIG. 14C, the top gate electrodes 50 are arranged so as not overlap with data lines 72, respectively. Although it may be made a structure of FIG. 14B in order to obtain the effect of the present invention, the embodiment shown in FIG. 14C is preferable in view of that not only an electric potential of a data line 72 hardly affect the gate electrodes 50, but also parasitic capacitance between the gate electrodes 50 and the data lines 72 can be reduced remarkably.

As stated above, when it is a single channel type device formed with either one of an n-channel type transistor or a p-channel type transistor, a method of forming the low voltage TFT and the high voltage TFT on the same substrate should introduce impurities of N type or P type with high concentration or with low concentration if needed. When it is a CMOS device, as shown in FIG. 15 and FIG. 16, impurities of N type or P type is introduced with low concentration, and with the high concentration if needed. Thus it is possible to fabricate different CMOS TFT substrates respectively according to need such as the low voltage TFT and the high voltage TFT with either one of the n-channel type transistor or the p-channel type transistor, and the low voltage TFT and the high voltage TFT with both type of the n-channel type transistor or the p-channel type transistor.

Each configuration shown in FIG. 15 and FIG. 16 basically adopts a configuration shown in FIG. 13. In the low voltage TFT and the high voltage TFT using n-channel type TFTs shown in FIG. 15A and FIG. 15B, an n type source region 41 (n) and an n type drain region 42 (n) are provided respectively. And in the low voltage TFT and the high voltage TFT using p-channel type TFTs shown in FIG. 16A and FIG. 16B, a p type source region 41 (p) and a p type drain region 42 (p) are provided respectively. Because other components are same as the configuration shown in FIG. 13, those descriptions are omitted.

[Exemplary Embodiment 5]

Figure 17A:
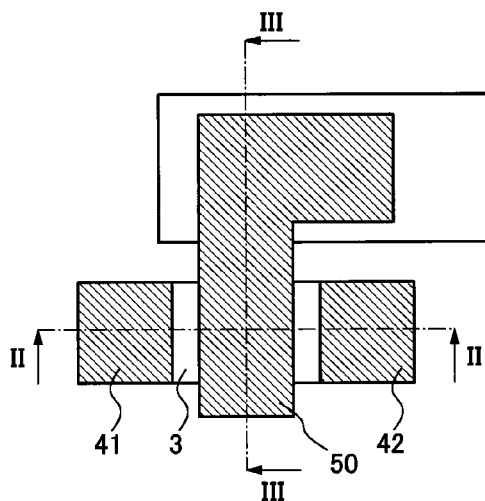
FIG. 17A is a schematic plan view showing a TFT configuration according to a fifth exemplary embodiment of the present invention.
Figure 17C:
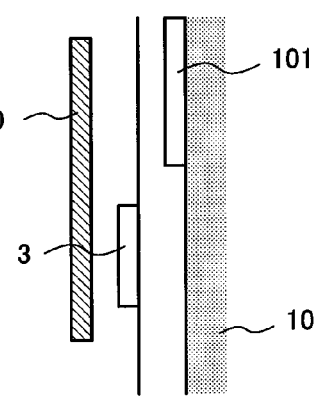
FIG. 17C is a cross sectional view of the TFT configuration taken along a dashed line III-III shown in FIG. 17A.
Figure 17B:
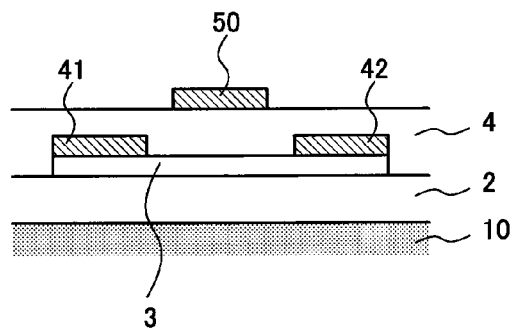
FIG. 17B is a cross sectional view of the TFT configuration taken along a dashed line II-II shown in FIG. 17A.

A fifth exemplary embodiment will be described by referring to FIG. 17. FIG. 17A shows a plan view, FIG. 17B shows a sectional view taken along a dotted line II-II shown in FIG. 17A, and FIG. 17C shows a sectional view taken along a dotted line III-III shown in FIG. 17A, respectively.

On the insulating substrate 10, a metal wiring of a gate terminal layer 101 is formed and covered with a first insulating layer 2. A semiconductor layer 3 is formed on the first insulating layer 2. The semiconductor layer 3 is provided with a source region 41 and a drain region 42, and covered with second insulating layer 4. A top gate electrode layer 50 is formed on the second insulating layer 4. The top gate electrode layer 50 has a first area and a second area such that the first area is overlapped with the semiconductor layer 3 (including source/drain regions) and the second area is overlapped with the gate terminal layer 101 without overlapping with the semiconductor layer 3.

A gate signal which drives this transistor is supplied to the top gate electrode layer 50 from the gate terminal layer 101 via the second area. A desired signal/voltage is supplied to source/drain wiring lines made of a conductive layer (it corresponds to the reference numeral 70 in FIG. 2) connected to the source region 41 and the drain region 42 via contact holes (not shown). This TFT according to the fifth exemplary embodiment is driven by the top gate electrode 50 and which can be used either the high voltage TFT or the low voltage TFT by selecting the thickness of the top gate insulating film 4 and/or the channel length.

Because the semiconductor layer (including source/drain regions) is formed on a flat surface compared with a configuration where the semiconductor layer is formed on the bottom gate electrode, it is easy to control the manufacturing process such as a laser crystallization process and a lithography process. Even if a gate leak occurs due to a defect related to the production, because the top gate electrode 50 is separated from the gate terminal layer 101 with the insulating layer disposed between them without touching directly, a fatal defect can be avoided by preventing an over current flowing to an entire system.

[Exemplary Embodiment 6]

Figure 18A:
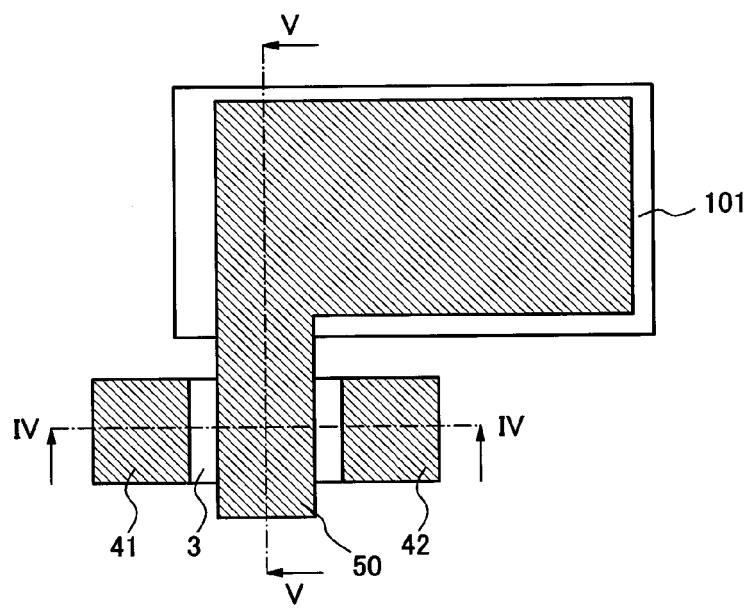
FIG. 18A is a schematic plan view showing a TFT configuration according to a sixth exemplary embodiment of the present invention.
Figure 18C:
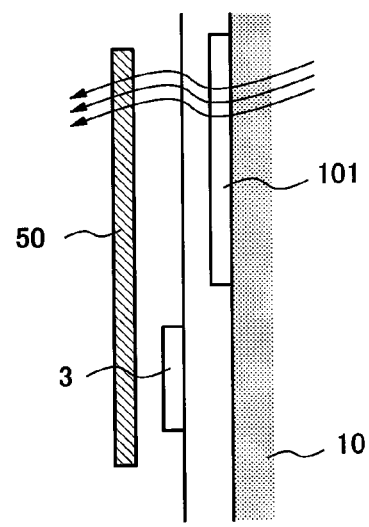
FIG. 18C is a cross sectional view of the TFT configuration taken along a dashed line V-V shown in FIG. 18A.
Figure 18B:
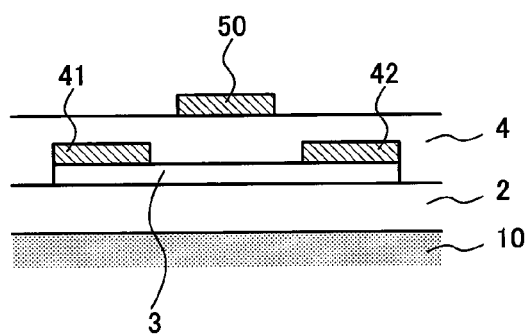
FIG. 18B is a cross sectional view of the TFT configuration taken along a dashed line IV-IV shown in FIG. 18A.

The sixth exemplary embodiment will be described referring to FIG. 18. FIG. 18A shows a plan view, FIG. 18B shows a sectional view taken along a dotted line IV-IV shown in FIG. 18A, and FIG. 18C shows a sectional view taken along a dotted line V-V shown in FIG. 18A, respectively.

On a transparent insulating substrate 10, a transparent conductive wiring of a gate terminal layer 101 made of ITO (indium tin oxide) is formed and covered with a $SiO_2$ layer as the first insulating layer 2. A transparent semiconductor layer 3 made of InGaZnO (transparent semiconductor including oxides of indium, gallium and zinc) is formed on the first insulating layer 2. The semiconductor layer 3 is provided with a source region 41 and a drain region 42 made of the ITO layer, and covered with the $SiO_2$ layer as a second insulating layer 4. A transparent top gate electrode layer 50 made of ITO is formed on the second insulating layer 4. The top gate electrode layer 50 has first and second areas such that the first area is overlapped with the semiconductor layer 3 (including source/drain regions) and the second area is overlapped with the gate terminal layer 101 without overlapping with the semiconductor layer 3.

Although InGaZnO is used as the transparent semiconductor layer in the above-mentioned exemplary embodiment, other oxide semiconductors such as ZnO, AlZnSnO, InHfZnO, and ZnSnO in either crystalline or amorphous can be used. As for the transparent conductor, the above-mentioned ITO may be replaced by other transparent conductor such as InZnO.

A gate signal which drives this transistor is supplied to the top gate electrode layer 50 from the gate terminal layer 101 via the second area in a similar manner described in the fifth exemplary embodiment. A desired signal/voltage is supplied to source/drain wiring lines made of a conductive layer (not shown) connected to the source region 41 and the drain region 42 via contact holes (not shown). This TFT according to the sixth exemplary embodiment is driven by the top gate electrode 50 and which can be used either the high voltage TFT or the low voltage TFT by selecting the thickness of the top gate insulating film 4 and/or the channel length.

According to the structure of this exemplary embodiment, following advantage can be obtained in addition to the benefit described in the fifth exemplary embodiment. In a device to which it is required to transmit a light as illustrated with three wavy-arrows in FIG. 18C by a transparent structure like a liquid crystal display device, for example, because each of the overlapped areas of the gate electrode layer and the gate terminal layer is made of optically transparent material, it is possible to form an overlapped area of the gate electrode layer and the gate terminal layer even in a pixel region of a TFT substrate of a liquid crystal display panel, and thereby increasing induced capacity at those layers and result in a more stable transistor operation.

In the above-mentioned exemplary embodiment, although $SiO_2$ is used as the insulating film, SiN layer can be used instead of that. Because a refractive index of SiN is close to that of ITO, a reflection due to refractive index difference at interface can be suppressed, and thus optical transmittance of the display device can be improved. This exemplary embodiment can be applied not only to the liquid crystal display device but also to an organic EL (electro luminescence) display device and an image sensing device which utilize the optical function for a large area.

The present invention is available in a transistor circuitry substrate having different type of TFTs such as high voltage TFT having relatively high withstood voltage and low voltage TFT having relatively low breakdown voltage capability on the same substrate.

According to the exemplary embodiments of the present invention, by means of a selection of whether a top gate electrode layer is formed or not, it is possible to separately provide a plural types of TFTs having different breakdown voltage capability characteristics on the same substrate with least steps for forming the top gate electrode. In particular, it is possible to separately provide the low voltage TFT driven at high speed and the high voltage TFT having a high breakdown voltage capability easily, and an increase of production cost can be suppressed.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A thin film transistor comprising:
a first insulating layer formed or an insulating substrate;
a first semiconductor layer formed on said first insulating layer;
a second insulating layer formed on said first semiconductor layer,
a first conductive layer disposed between said insulating substrate and said first insulating layer; and
a second conductive layer with a floating state formed on said second insulating layer, said second conductive layer including a first area and a second area such that said first area is a top gate electrode area overlapped with said first semiconductor layer while said second area is a capacity coupling area overlapped with said first conductive layer in the area which is not overlapped with said first semiconductor layer, and a size of said second area is made larger than that of said first area so that an electric potential at said second conductive layer is in a vicinity of an electric potential at said first conductive layer.

2. The thin film transistor according to claim 1, wherein an area ratio of said top gate electrode region and said capacity coupling region is more than or equal to eight.

3. The thin film transistor according to claim 1, wherein said first conductive layer includes a bottom gate electrode region which overlaps with said first semiconductor layer.

4. The thin film transistor according to claim 1, wherein said first conductive layer is not formed at an area which overlaps with said first semiconductor layer.

5. The thin film transistor according to claim 4, wherein said insulating substrate, said first insulating layer and said second insulating layer are made of transparent material, respectively.

6. A thin film transistor substrate comprising:
the thin film transistor according to claim 3 provided on said insulating substrate occupying a first thin film transistor area; and
a second thin film transistor formed on said insulating substrate to occupy a second thin film transistor area, said second thin film transistor including:
said first insulating layer formed on said insulating substrate;
a second semiconductor layer formed on said first insulating layer;
said second insulating layer formed on said second semiconductor layer; and
a second bottom gate electrode layer formed between said insulating substrate and said first insulating layer so as to overlap with said second semiconductor layer in said second thin film transistor area, wherein said second conductive layer does not exist at an area overlapped with said second semiconductor layer on said second insulating layer.

7. The thin film transistor substrate according to claim 6, wherein a thickness of said second insulating layer is thinner than that of said first insulating layer in areas overlapped with said first semiconductor layer and said second semiconductor layer, respectively.

8. The thin film transistor substrate according to claim 6, wherein a first insulating layer capacity per unit area of said second insulating layer between said top gate electrode region and said first semiconductor layer is larger than a second insulating layer capacity per unit area of said first insulating layer between said bottom gate electrode region and said first semiconductor layer.

9. The thin film transistor substrate according to claim 6, wherein said first insulating layer has a thickness more than or equal to 200 nm.

10. The thin film transistor substrate according to claim 6, wherein each of said first semiconductor layer and said second semiconductor layer is provided with a source region and a drain region within or in a vicinity of said first semiconductor layer and said second semiconductor layer, respectively, and said bottom gate electrode region is overlapped with a part of said source region and said drain region in said first thin film transistor area while said top gate electrode region is not overlapped with said source region and said drain region.

11. The thin film transistor substrate according to claim 6, wherein all areas of said second conductive layer are overlapped with said first conductive layer in said first thin film transistor area.

12. The thin film transistor substrate according to claim 6, wherein within said first thin film transistor area, a thickness of an insulating film between said second conductive layer and said first conductive layer in an area where said second conductive layer does not overlap with said first semiconductor layer is made thinner than a thickness of an insulating film between said top gate electrode region and said bottom gate electrode region in an area where said second conductive layer overlaps with said first semiconductor layer.

* * * * *